(12) United States Patent
Zhang et al.

(10) Patent No.: US 8,692,446 B2
(45) Date of Patent: Apr. 8, 2014

(54) OLED LIGHT EXTRACTION FILMS HAVING NANOPARTICLES AND PERIODIC STRUCTURES

(75) Inventors: Jun-Ying Zhang, Woodbury, MN (US);
Encai Hao, Woodbury, MN (US);
Vivian W. Jones, Woodbury, MN (US);
Terry L. Smith, Roseville, MN (US);
Sergey A. Lamansky, Apple Valley, MN (US); Ha T. Le, Saint Paul, MN (US);
Dawn Qiu, Saint Paul, MN (US);
William B. Kolb, West Lakeland, MN (US); James M. Battiato, Saint Paul, MN (US); David B. Stegall, Saint Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 133 days.

(21) Appl. No.: 13/050,324

(22) Filed: Mar. 17, 2011

(65) Prior Publication Data
US 2012/0234460 A1   Sep. 20, 2012

(51) Int. Cl.
*H01J 5/16* (2006.01)
(52) U.S. Cl.
USPC .............................. 313/116; 313/504; 156/67
(58) Field of Classification Search
USPC ........ 313/110, 111, 116, 504; 156/67; 445/24
See application file for complete search history.

(56) References Cited

U.S. PATENT DOCUMENTS

| | | | |
|---|---|---|---|
| 6,015,719 A | 1/2000 | Kish | |
| 6,787,796 B2 | 9/2004 | Do | |
| 7,094,122 B2 | 8/2006 | Toguchi | |
| 7,098,590 B2 | 8/2006 | Lim | |
| 7,122,845 B2 | 10/2006 | Uchida | |
| 7,140,812 B2 | 11/2006 | Bryan | |
| 7,247,394 B2 | 7/2007 | Hatwar | |
| 7,468,211 B2 | 12/2008 | McCormick | |
| 7,589,461 B2 | 9/2009 | Park | |
| 7,602,117 B2 | 10/2009 | Yamada | |
| 7,758,919 B2 | 7/2010 | Ozin | |
| 2003/0152703 A1 | 8/2003 | Hammond | |
| 2005/0007000 A1* | 1/2005 | Chou et al. | 313/116 |
| 2005/0026530 A1* | 2/2005 | Toguchi et al. | 445/24 |
| 2007/0020451 A1 | 1/2007 | Padiyath | |

(Continued)

FOREIGN PATENT DOCUMENTS

JP    2004-311419    11/2004
JP    10-2006-0061017    6/2006

(Continued)

OTHER PUBLICATIONS

Chari, "P-175: Enhanced Outcoupling of Light from Organic Light-Emitting Diodes by Microlens Arrays Based on Breath-Figure Template", SID 07 Digest, SID conference May 20-25, 2007, pp. 852-855.

(Continued)

*Primary Examiner* — Andrew Coughlin
(74) *Attorney, Agent, or Firm* — Lance L. Vietzke (57) ABSTRACT

A light extraction film having nanoparticles with engineered periodic structures. The light extraction film includes a substantially transparent substrate, low index one-dimensional or two-dimensional periodic structures on the substrate, and a high index planarizing backfill layer applied over the periodic structures. Light scattering nanoparticles are either applied in a layer over the periodic structures or included in the backfill layer.

9 Claims, 9 Drawing Sheets

(56) References Cited

U.S. PATENT DOCUMENTS

| | | | |
|---|---|---|---|
| 2007/0201056 A1* | 8/2007 | Cok et al. | 358/1.9 |
| 2007/0298193 A1 | 12/2007 | Nakamura | |
| 2008/0037274 A1* | 2/2008 | Chang | 362/608 |
| 2008/0088933 A1* | 4/2008 | Lin | 359/599 |
| 2008/0137367 A1* | 6/2008 | Kim et al. | 362/607 |
| 2009/0015142 A1 | 1/2009 | Potts | |
| 2009/0015757 A1 | 1/2009 | Potts | |
| 2010/0110551 A1 | 5/2010 | Lamansky | |
| 2010/0128351 A1 | 5/2010 | Epstein | |
| 2010/0150513 A1 | 6/2010 | Zhang | |
| 2011/0229992 A1 | 9/2011 | Potts | |
| 2011/0262093 A1 | 10/2011 | Lamansky | |

FOREIGN PATENT DOCUMENTS

| | | |
|---|---|---|
| JP | 2006-190573 | 7/2006 |
| JP | 2007-335253 | 12/2007 |
| WO | WO 2009/158158 A2 * | 12/2009 |
| WO | WO 2010-077521 | 7/2010 |
| WO | WO 2010-120468 | 10/2010 |
| WO | WO 2010-120864 | 10/2010 |
| WO | WO 2011-088161 | 7/2011 |

OTHER PUBLICATIONS

Cui, "Integration of colloidal nanocrystals into lithographically patterned devices", Nano Letters, 2004, vol. 4, No. 6, pp. 1093-1098.

Do, "Enhanced light extraction efficiency from organic light emitting diodes by insertion of a two-dimensional photonic crystal structure", Journal of Applied Physics, 2004, vol. 96, No. 12, pp. 7629-7636.

Fichet, "Self-Organized Photonic Structures in Polymer Light-Emitting Diodes", Advanced Materials, Nov. 2004, vol. 16, No. 21, pp. 1908-1912.

Fujita, et al. "Optical and electrical characteristics of organic light-emitting diodes with two-dimensional photonic crystals in organic/electrode layers", Jpn. J. Appl. Phys. 2005, vol. 44, No. 6A, pp. 3669-3677.

Geoffrey, "The Race for the Photonic Chip: Colloidal Crystal Assembly in Silicon Wafers", Advanced Functional Materials, Apr. 2001, vol. 11 No. 2, pp. 95-104.

Kim, "Planarized SiNx/spin-on-glass photonic crystal organic light-emitting diodes", Appl. Phys. Letters, 2006, vol. 89, pp. 173502-173502-3.

Lee et al.,"Far-field radiation of photonic crystal organic light-emitting diode", Optics Express, Jul. 2005, vol. 13, No. 15, pp. 5864-5870.

Lee, et al., "A high-extraction-efficiency nanopatterned organic light-emitting diode", Appl. Phys. Lett., May 2003, vol. 82, No. 21, pp. 3779-3781.

Lin, "P-179: Low Blur Effect and High Light Extraction Efficiency Enhancement of Organic Light Emitting Displays with Novel Microstructure Attachment", SID 07 Digest, SID conference May 20-25, 2007, pp. 867-870.

Matterson, "Increased Efficiency and Controlled Light Output from a Microstructure Light-Emitting Diode", Advanced Materials, Jan. 2001, vol. 13, No. 2, pp. 123-127.

Neyts, "Microcavity effects and the outcoupling of light in displays and lighting applications based on thin emitting films", Applied Surface Science, Jan. 2005, vol. 244, No. 1-4, pp. 517-523.

Peng, "Enhanced coupling of light from organic light emitting diodes using nonporous films", Journal of Applied Physics, Aug. 2004, vol. 96, No. 3, pp. 1649-1654.

Schnitzer et al., "30% external quantum efficiency from surface textured, thin-film light-emitting diodes", Appl. Phys. Lett., Oct. 1993, vol. 63, No. 16, pp. 2174-2176.

Schnitzer et al., "Ultrahigh spontaneous emission quantum efficiency, 99.7% internally and 72% externally, from AlGaAs/GaAs/AlGaAs double heterostructures", Appl. Phys. Lett., Jan. 1993, vol. 62, No. 2, pp. 131-133.

Stegall, "OLED light extraction with roll-to-roll nanostructured films", Proc. of the SPIE, 2009, vol. 7415, pp. 74150S-74150S-8.

Xia, "Lithographically directed deposition of nanopartilces using spin coating", J. Vac. Sci. Technol., Dec. 2004, vol. B 22, No. 6, pp. 3415-3420.

Yamasaki, et al., "Organic light-emitting device with an ordered monolayer of silica microspheres as a scattering medium", Appl. Phys. Lett., Mar. 2000, vol. 76, No. 10, pp. 1243-1245.

Yang, "Microcavity top-emitting organic light-emitting devices integrated with microlens arrays: Simultaneous enhancement of quantum efficiency, cd/A efficiency, color performances, and image resolution", Appl. Phys. Lett. 2007, vol. 91, No. 25, pp. 253508-1-253508-3.

Zheng, "Two component particle arrays on patterned polyelectrolyte multilayer templates", Advanced Materials, Apr. 2002, vol. 14, No. 8, pp. 569-572.

* cited by examiner

OLED LIGHT EXTRACTION FILMS HAVING NANOPARTICLES AND PERIODIC STRUCTURES

BACKGROUND

Organic Light Emitting Diode (OLED) devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

In OLED devices, over 70% of the generated light is typically lost due to processes within the device structure. The trapping of light at the interfaces between the higher index organic and Indium Tin Oxide (ITO) layers and the lower index substrate layers is the major cause of this poor extraction efficiency. Only a relatively small amount of the emitted light emerges through the transparent electrode as "useful" light. The majority of the light undergoes internal reflections, which result in its being emitted from the edge of the device or trapped within the device and eventually being lost to absorption within the device after making repeated passes.

Light extraction films use internal nanostructures to avoid waveguiding losses within the device. While providing strong light extraction, internal nanostructures, comprising regular features such as photonic crystals or linear gratings, tend to produce diffraction-related variations in the angular and spectral distributions of the emitted light, which may not be desirable in final applications. Thus, a need exists for a light extraction film that simultaneously enhances the efficiency of light extraction via the nanostructures, while also reducing undesirable luminance and color angular non-uniformity in the light output.

SUMMARY

A light extraction film, consistent with the present invention, includes a substantially transparent substrate, low-index periodic structures on the substrate, and a high-index planarizing backfill layer applied over the periodic structures. Light scattering nanoparticles are either applied in a monolayer or sub-monolayer over the periodic structures, or are included in the backfill layer.

The combination of periodic structures with light scattering nanoparticles provides for enhanced light extraction with a more uniform luminance and spectral distribution.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Embodiments of the present invention relate to light extraction films and uses of them for OLED devices. Examples of light extraction films are described in U.S. Patent Applications Publication Nos. 2009/0015757 and 2009/0015142, both of which are incorporated herein by reference as if fully set forth.

Figure 1:
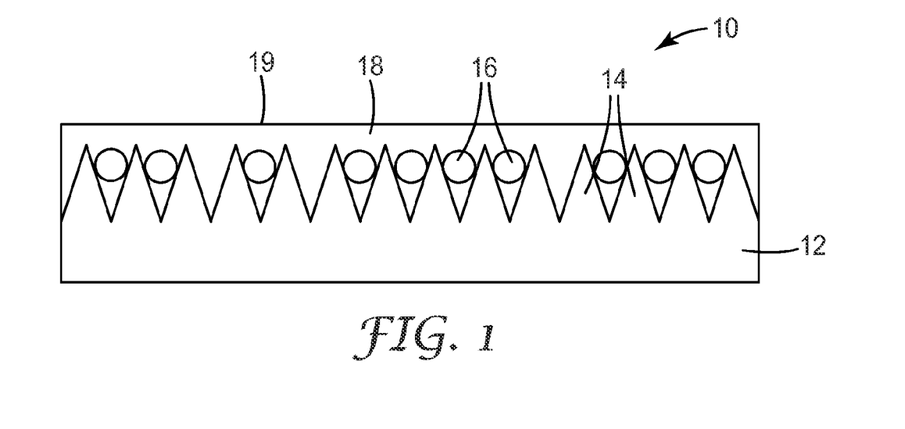
FIG. 1 is a diagram of a light extraction film having nanoparticles applied in a sub-monolayer over periodic structures.

FIG. 1 is a diagram of the construction of a light extraction film 10 having periodic structures with nanoparticles positioned on the periodic structures. Light extraction film 10 includes a substantially transparent substrate 12 (flexible, rigid, or in a window layer), low index periodic structures 14, nanoparticles 16 dispersed in a surface layer manner over periodic structures 14, and a high index planarizing backfill layer 18 forming a substantially planar surface 19 over periodic structures 14 and nanoparticles 16. The term "substantially planar surface" means that the backfill layer planarizes the underlying layer, although slight surface variations may be present in the substantially planar surface.

Figure 2:
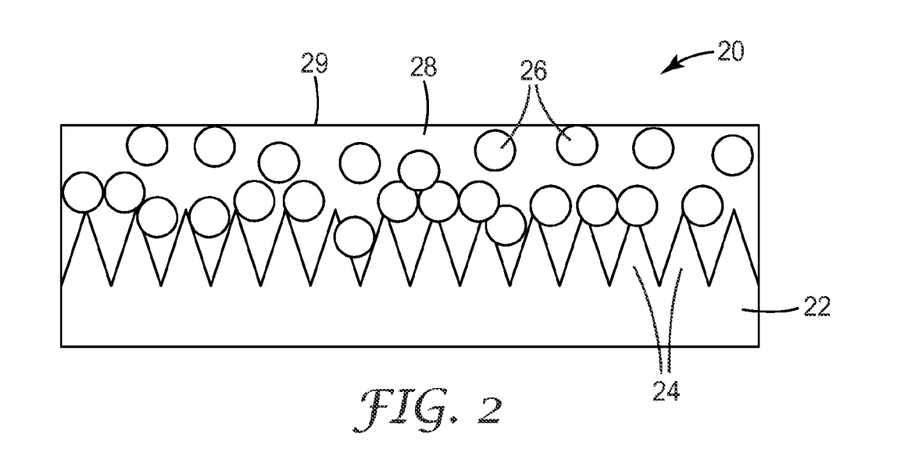
FIG. 2 is a diagram of a light extraction film having nanoparticles distributed throughout a backfill layer.

FIG. 2 is a diagram of the construction of another light extraction film 20 having periodic structures and nanoparticles. Light extraction film 20 includes a substantially transparent substrate 22 (flexible, rigid, or in a window layer), low index periodic structures 24, nanoparticles 26, and a high index planarizing backfill layer 28 forming a substantially planar surface 29 over periodic structures 24 and nanoparticles 26. In this embodiment, nanoparticles 26 are distributed throughout backfill layer 28, such as in a volume distribution, rather than in a surface layer manner as shown for light extraction film 10.

Figure 3:
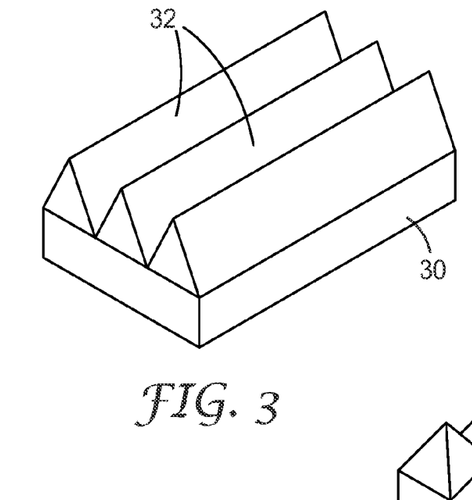
FIG. 3 is a perspective diagram of one-dimensional periodic structures.

The periodic structures for light extraction films 10 and 20 can be formed integrally with the substrate, as illustrated in the Examples, or in a layer applied to the substrate. For example, the periodic structures can be formed on the substrate by applying to the substrate a low-index material and subsequently patterning the material. Also, the periodic structures can be implemented with nanostructures or microstructures. Nanostructures are structures having at least one dimension, such as width, less than 1 micron. Microstructures are structures having at least one dimension, such as width, between 1 micron and 1 millimeter. The periodic structures for light extraction films 10 and 20 can be one-dimensional (1D), meaning they are periodic in only one dimension, that is, nearest-neighbor features are spaced equally in one direction along the surface, but not along the orthogonal direction. In the case of 1D periodic nanostructures, the spacing between adjacent periodic features is less than 1 micron. One-dimensional structures include, for example, continuous or elongated prisms or ridges, or linear gratings. FIG. 3 is a perspective view illustrating 1D periodic structures 32, in this example linear prisms, on a substrate 30.

Figure 4:
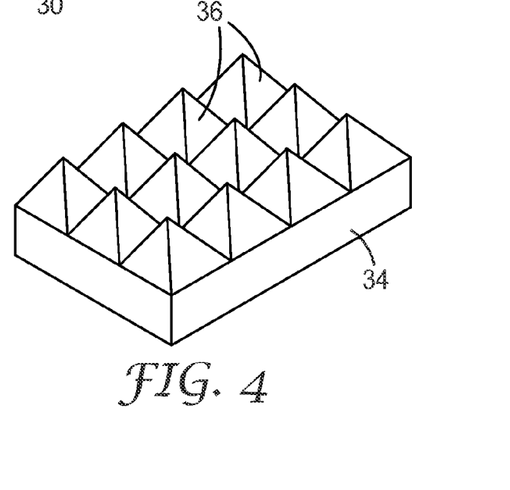
FIG. 4 is a perspective diagram of two-dimensional periodic structures.

The periodic structures for light extraction films 10 and 20 can also be two-dimensional (2D), meaning they are periodic in two dimensions, that is, nearest neighbor features are spaced equally in two different directions along the surface. In the case of 2D nanostructures, the spacing in both directions are less than 1 micron. Note that the spacing in the two different directions may be different. Two-dimensional structures include, for example, lenslets, pyramids, trapezoids, round or square shaped posts, or photonic crystal structures. Other examples of two-dimensional structures include curved sided cone structures as described in U.S. Patent Application Publication No. 2010/0128351, which is incorporated herein by reference as if fully set forth. FIG. 4 is a perspective view illustrating 2D periodic structures 36, in this example pyramids, on a substrate 34.

The nanoparticles, also referred to as sub-micron particles, for light extraction films 10 and 20 have a size within the range for nanostructures and can be the same size or different sizes within that range for a particular film. The nanoparticles are also light scattering when the nanoparticles are within a particular size range and have a different index of refraction from the backfill layer, as further explained below and illustrated in the Examples. For example, the nanoparticles can have diameters in the range of 100 nm to 1,000 nm, or the nanoparticles can have diameters in the range of 10 nm to 300 nm and form agglomerations with sizes in the range of 100 nm to 1,000 nm. Furthermore, the nanoparticles can be implemented with mixed particles sizes, large and small nanoparticles mixed together such as 300 nm nanoparticles mixed with 440 nm or 500 nm nanoparticles, which can result in an increased spectral response of the corresponding light extraction film. The nanoparticles can possibly have sizes outside the range for nanostructures depending upon a particular application. For example, if the light extraction film is used for OLED lighting, as opposed to displays, then the nanoparticles can have diameters up to several microns. The nanoparticles can be composed of organic materials or other materials, and they can have any particle shape, regular or irregular. The nanoparticles can alternatively be implemented with porous particles. Examples of nanoparticles used in light extraction films are described in U.S. Patent Application Publication No. 2010/0150513, which is incorporated herein by reference as if fully set forth.

For light extraction film 10 having nanoparticles 16 distributed in a surface layer manner, the layer of nanoparticles can be implemented with nanoparticles in a monolayer, with a layer having agglomerations of nanoparticles, or in a multi-layer. The nanoparticles can be coated without use of a binder, which can result in the agglomerations of nanoparticles. In a preferred embodiment, nanoparticles 16 have a size, for example diameter, substantially equal to or slightly less than the pitch (e.g., one-fourth to one times the pitch) of periodic structures 14 such that the nanoparticles are at least partially ordered by the periodic structures, as illustrated in the Examples. The at least partial ordering can occur through the particles becoming aligned or assembled within the periodic structures, as illustrated in the Examples. The pitch of the periodic structures refers to the distance between adjacent structures, for example the distance between the apexes of adjacent prisms. Size matching can be used to achieve the at least partial ordering, for example 440 nm nanoparticles with 600 nm pitch periodic structures or 300 nm nanoparticles with 500 nm pitch periodic structures. In addition, the shape and aspect ratio of the periodic structures can be factors in determining the size matching and partial ordering of the nanoparticles.

The planarizing backfill layers for light extraction films 10 and 20 are applied over the periodic structures and particle coatings to planarize them and provide for index contrast. A low index periodic structure with a high index backfill layer means that backfill layer has a higher index of refraction than the periodic structures and that the backfill layer and periodic structures have a sufficient difference in refractive indices, preferably 0.2 or greater, to enhance light extraction of an OLED device in optical communication with the light extraction films. The light extraction film can be in optical communication with the OLED device by having the planar surface of the backfill layer placed against, either directly or through another layer, the light output surface of the OLED device. The planarizing backfill layer can optionally be implemented with an adhesive for bonding the light extraction film to the light output surface of the OLED device. Examples of high index backfill layers for light extraction films are described in U.S. Patent Application Publication No. 2010/0110551, which is incorporated herein by reference as if fully set forth.

Materials for the substrates, low index periodic structures, high index backfill layers, and nanoparticles for light extraction films 10 and 20 are provided in the published patent applications identified above. For example, the substrate can be implemented with glass, PET, polyimides, TAC, PC, polyurethane, PVC, or flexible glass. Processes for making light extraction films 10 and 20 are also provided in the published patent applications identified above. Optionally, the substrate can be implemented with a barrier film to protect a device incorporating the light extraction film from moisture or oxygen. Examples of barrier films are disclosed in U.S. Patent Application Publication No. 2007/0020451 and U.S. Pat. No. 7,468,211, both of which are incorporated herein by reference as if fully set forth.

Figure 5:
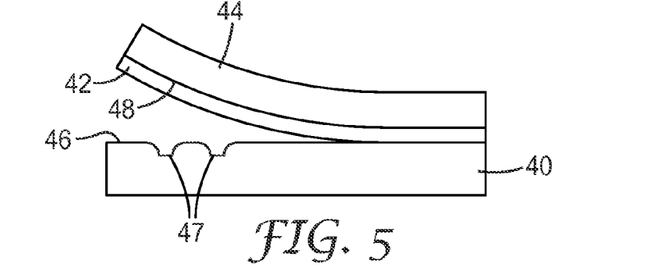
FIG. 5 is a diagram illustrating laminating a light extraction film to an OLED device.
Figure 6:
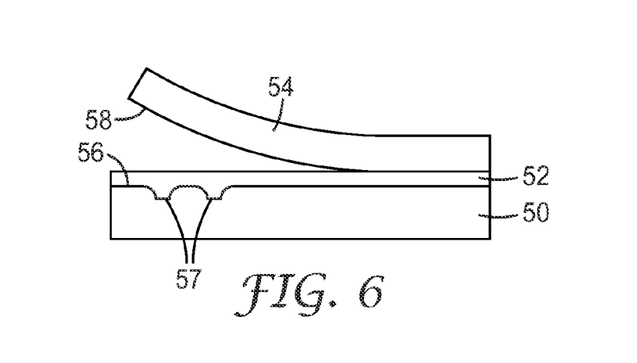
FIG. 6 is a diagram illustrating laminating a light extraction film to an OLED device.

FIGS. 5 and 6 illustrate the use of an optical coupling layer in order to optically couple and potentially adhere a light extraction film to an OLED device. As shown in FIG. 5, an optical coupling layer 42 is applied to a planar surface 48 of the backfill layer in a light extraction film 44, which can then be laminated to a light output surface 46 of an OLED device 40. The optical coupling layer can be implemented with an adhesive providing for optical coupling between the light output surface of the OLED device and the backfill layer of the light extraction film. Use of an adhesive as the optical coupling layer along with a lamination process can also serve to adhere the light extraction film to the OLED device and remove air gaps between them. The backplane morphology of the OLED device is typically non-planar, as represented by pixel wells 47, and optical coupling layer 42 is expected to conform to or expand into the pixel well geometry filling the gap between light extraction film 44 and OLED device 40.

Alternatively, as shown in FIG. 6, an optical coupling layer 52 is applied to a light output surface 56 of an OLED device 50, and a planar surface 58 of the backfill layer in a light extraction film 54 is then laminated to OLED device 50. If the adhesive optical coupling layer is applied to the OLED device before lamination of the light extraction film, as shown in FIG. 6, the optical coupling layer can also serve to planarize the light output surface of the OLED device. For example, a top emitting active matrix OLED display backplane does not necessarily have a high degree of planarity, as represented by pixel wells 57, in which case the optical coupling layer can be pre-deposited onto the cathode or any other top layer of the OLED stack prior to lamination of the light extraction film. Such pre-deposition of the optical coupling layer can reduce non-planarity of the backplane and the device, allowing for subsequent lamination of the light extraction film. The optical coupling layer in this case can be coated onto the OLED display with solution deposition methods. For example, it can be applied onto the entire area of the OLED from a liquid formulation, in which case after lamination of the light extraction film it can be optionally cured using UV or thermal curing methods. It can also be laminated as an optical coupling film provided separately between two liners with prior removal of the liner facing the OLED device, in which case it is expected to conform or expand into the pixel wells. After application of the optical coupling layer a sufficient planarization over the backplane morphology is produced as shown in FIG. 6.

Since the backplane morphology determines the distance between the extraction elements (nanoparticles and periodic structure) and OLED devices, it is required that the materials for the optical coupling layer have a high index of refraction (e.g., 1.6-2.2) comparable to that of OLED organic and inorganic layers (e.g., ITO). Such materials include inorganic oxides and nitrides such as $TiO_2$ and SiN, organic materials such as triarylamines (e.g., EL022T from Hodogaya Chemical Co., Japan), and formulations including both inorganic and organic components (e.g., $TiO_2$ nanoparticles dispersed in thermally or UV-curable resins).

As an alternative to a separate optical coupling layer, the high index backfill layer itself may be comprised of a high index adhesive, so that the optical and planarizing functions of the backfill, and the adhering function of the adhesive optical coupling layer, are performed by the same layer.

EXAMPLES

All parts, percentages, ratios, etc. in the examples are by weight, unless noted otherwise. Solvents and other reagents used were obtained from Sigma-Aldrich Chemical Company; Milwaukee, Wis. unless specified differently.

Materials

| Abbreviation/product name | Description | Available from |
| --- | --- | --- |
| IRGACURE 127 | Photoinitiator | Ciba Specialty Chemicals, Tarrytown, NY |
| MP4540M | colloidal solution | Nissan Chemical America, Houston, TX |
| PHOTOMER 6210 | aliphatic urethane diacrylate | Cognis Corporation, Cincinnati, OH |
| SILQUEST A-174 | 3-methacryloxypropyl-trimethoxysilane | Momentive Performance Materials, Inc., Friendly, WV |
| SOLPLUS D510 | polyester-polyamine copolymer | Lubrizol, Cleveland, OH |
| SR238 | 1,6 hexanediol diacrylate | Sartomer Company, Exton, PA |
| SR833S | difunctional acrylate monomer | Sartomer Company, Exton, PA |
| TX13112 | colloidal solution | Nalco Chemical Company, Naperville, IL |

Preparative Examples

Preparation of A-174 modified 200 nm Silica

In a 500 mL flask, equipped with a condenser and a thermometer, 151.8 g of TX13112 colloidal solution and 180 g of 1-methoxy-2-propanol were mixed together under rapid stirring. 1.48 g of SILQUEST A-174 was then added. The mixture was heated to 80° C. for 16 hours. 150 g of additional 1-methoxy-2-propanol was then added. The resulting solution was allowed to cool down to room temperature. Most of the water and 1-methoxypropanol solvents were removed using a rotary evaporator under 60° C. water-bath, resulting in 59.73% by weight A-174 modified 200 nm silica dispersion in 1-methoxy-2-propanol.

Preparation of A-174 Modified 440 nm Silica

In a 500 mL flask, equipped with a condenser and a thermometer, 200 g of MP4540M colloidal solution and 200 g of 1-methoxy-2-propanol were mixed together under rapid stirring. 0.6 g of SILQUEST A-174 was then added. The mixture was heated to 80° C. for 16 hours. 150 g of additional 1-methoxy-2-propanol was then added. The resulting solution was allowed to cool down to room temperature. Most of the water and 1-methoxypropanol solvents were removed using a rotary evaporator under 60° C. water-bath, resulting in 49.5% by weight A-174 modified 440 nm silica dispersion in 1-methoxy-2-propanol.

Preparation of D510 Stabilized 50 NM $TiO_2$ Nanoparticle Dispersions

A $TiO_2$ nanoparticle dispersion with an approximately 52% wt of $TiO_2$ was prepared using a milling process in the presence of SOLPLUS D510 and 1-methoxy-2-propanol. The SOLPLUS D510 was added in an amount of 25% wt based on $TiO_2$ weight. The mixture was premixed using a DISPERMAT mixer (Paul N. Gardner Company, Inc., Pompano Beach, Fla.) for 10 minutes and then a NETZSCH MiniCer Mill (NETZSCH Premier Technologies, LLC., Exton, Pa.) was used with the following conditions: 4300 rpm, 0.2 mm YTZ milling media, 250 ml/min flow rate. After 1 hour of milling, a white paste like $TiO_2$ dispersion in 1-methoxy-2-propanol was obtained. The particle size was determined to be 50 nm (Z-average size) using a Malvern Instruments ZETASIZER Nano ZS (Malvern Instruments Inc, Westborough, Mass.).

Preparation of 200 Nm Optical Nanoparticle Solution (Solution A):

5 g of A-174 modified 200 nm Silica, 0.746 g of SR833S, 68.8 g of isopropyl alcohol, and 0.06 g of IRGACURE 127 were mixed together to form a homogenous coating solution (Solution A).

Preparation of 440 Nm Optical Nanoparticle Solution (Solution B):

6.4 g of A-174 modified 440 nm silica, 0.792 g of SR833S, 72 g of isopropyl alcohol, and 0.07 g of IRGACURE 127 were mixed together to form a homogenous solution (Solution B).

Preparation of High Index Backfill with 440 nm Optical Nanoparticles (Solution C):

10 g of D510 stabilized 50 nm $TiO_2$ solution, 1.5566 g of A-174 treated 440 nm silica, 1.5567 g of SR833S, 14.5 g of 1-methoxy-2-propanol, 22.5 g of 2-butanone, and 0.05 g of IRGACURE 127 were mixed together to form a coating formulation (Solution C).

Preparation of High Index Backfill Solution (HI-BF):

20 g of D510 stabilized 50 nm $TiO_2$ solution, 2.6 g of SR833S, 0.06 g of IRGACURE 127, 25.6 g of 1-methoxy-2-propanol, 38.4 g of 2-butanone were mixing together to form a homogenous high index backfill solution.

Fabrication of Nanostructured Grating Film: 600 Nm 1D Structures

A 600 nm "sawtooth" grating film was fabricated by first making a multi-tipped diamond tool using focused ion beam (FIB) milling as described in U.S. Pat. No. 7,140,812. The diamond tool was then used to make a micro-replication roll which was then used to make 600 nm 1D structures on a PET film in a continuous cast and cure process utilizing a polymerizable resin made by mixing 0.5% (2,4,6 trimethyl benzoyl) diphenyl phosphine oxide into a 75:25 blend of PHOTOMER 6210 and SR238.

Examples 1A and 1B 200 nm $SiO_2$ Nanoparticles on 1D and 2D Structured Film

Solution A (200 nm $SiO_2$ nanoparticles) was coated onto film having 600 nm 1D structures (Example 1A) and onto film having 500 nm 2D structures (Example 1B) using #5 wire-wound rods (obtained from RD Specialties, Webster, N.Y.). The resulting films were then dried in air for 10 min and then cured using a Fusion UV-Systems Inc. Light-Hammer 6 UV (Gaithersburg, Md.) processor equipped with an H-bulb, operating under nitrogen atmosphere at 100% lamp power with a single pass at a line speed of 9.1 m/min (30 feet/min).

HI-BF solution was coated on the nanoparticle 1D and 2D structural films using a #10 wire-wound rod (obtained from RD Specialties, Webster, N.Y.). The resulting films were then dried in air for 10 min, then cured using the Fusion UV-Systems Inc. Light-Hammer 6 UV under the same conditions as described above.

Figure 7:
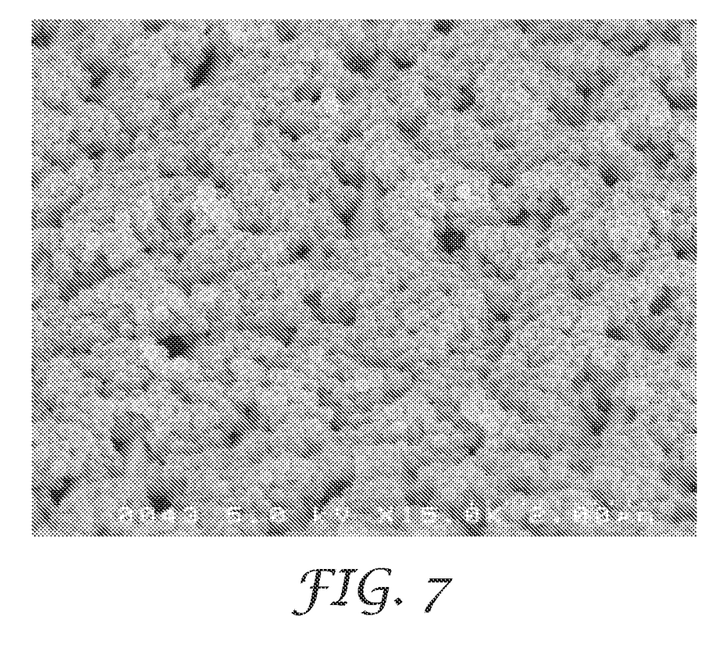
FIG. 7 is an image of nanoparticles coated on 1D structured film.
Figure 8:
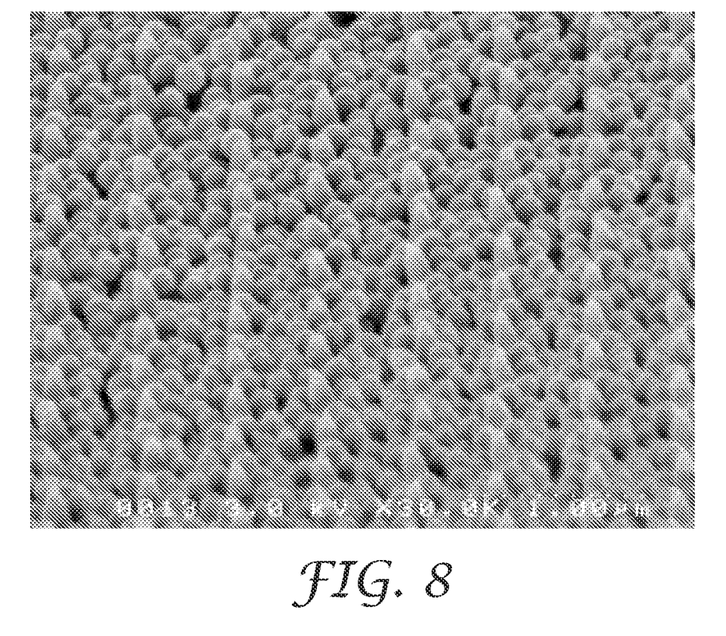
FIG. 8 is an image of nanoparticles coated on 2D structured film.

FIGS. 7 and 8 show SEM images of 200 nm $SiO_2$ nanoparticles coated on 1D and 2D structured film, respectively. FIG. 7 shows the nanoparticles clustering on a length scale on the order of the wavelength of visible light, and FIG. 8 shows fluctuations in the local density of the nanoparticles associated with the underlying 2D structures. After the backfill coating process the structured surface was very well planarized for both 1D and 2D structures with nanoparticles. In the case of the 1D structures, the nanoparticle coverage was higher than targeted, but it was found that 200 nm nanoparticles aggregated together to form 800 nm-1,000 nm larger particles with many intervening voids.

The 200 nm silica-nanoparticle-coated 1D pattern with backfill was then over-coated with a 100 nm thick layer of silicon nitride by plasma-enhanced chemical vapor deposition (PECVD, Model PLASMALAB System100 available from Oxford Instruments, Yatton, UK). The parameters used in the PECVD process are described in Table 1 below:

TABLE 1

Conditions used for depositing silicon nitride layer

| Reactant/Condition: | Value: |
|---|---|
| $SiH_4$ | 400 sccm |
| $NH_3$ | 20 sccm |
| $N_2$ | 600 sccm |
| Pressure | 650 mTorr |
| Temperature | 100° C. |
| High frequency power | 20 W |
| Low frequency power | 20 W |

The refractive index of the silicon nitride layer was measured using a Metricon Model 2010 Prism Coupler (Metricon Corporation, Pennington, N.J.), and was found to be 1.78. OLED fabrication on the above substrate began with approximately 110 nm-thick ITO deposited onto the backfill-coated nanoparticle/1D structured film through a 5 mm×5 mm pixilated shadow mask to define the anode geometry. Subsequently, a simple green organic emitting layer and cathode were deposited to complete the OLED. The OLEDs were fabricated by standard thermal deposition in a vacuum system at base pressure of about $10^{-6}$ Ton. The following OLED construction was deposited: HIL (300 nm)/HTL (40 nm)/Green EML (30 nm)/ETL (20 nm)/LiF (1 nm)/Al (200 nm). After completion, the OLED was encapsulated with an encapsulation barrier film employing SAES getter as a desiccant and oxygen scavenger in between the encapsulation film and the OLED cathode.

For comparison, an OLED was also constructed using 1D structured film without nanoparticles. Conoscope measurements showed that samples made with the 1D structured film produced small regions with relatively high intensity and somewhat larger regions with lower intensity surrounded by regions of relatively low intensity. In contrast, the conoscope data for samples made with 200 nm nanoparticles coated on 1D structured film showed a much more uniform intensity distribution. This data demonstrated that the 200 nm nanoparticles coated on 1D structured film significantly improved angular uniformity of the OLED device compared to 1D structured film without nanoparticles.

Examples 2A and 2B 440 nm $SiO_2$ Nanoparticles on 1D and 2D Structured Film

Figure 9A:
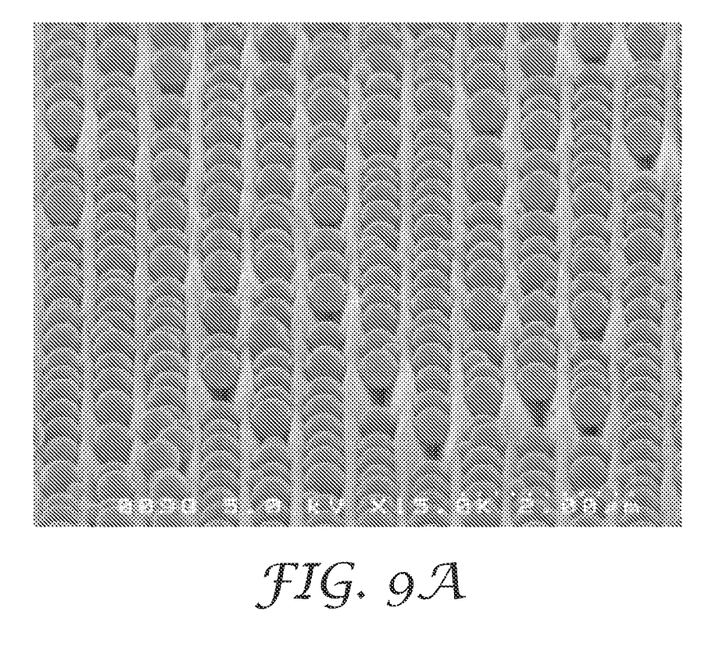
FIG. 9A is an image of a top view of nanoparticles on 1D structured film.
Figure 9B:
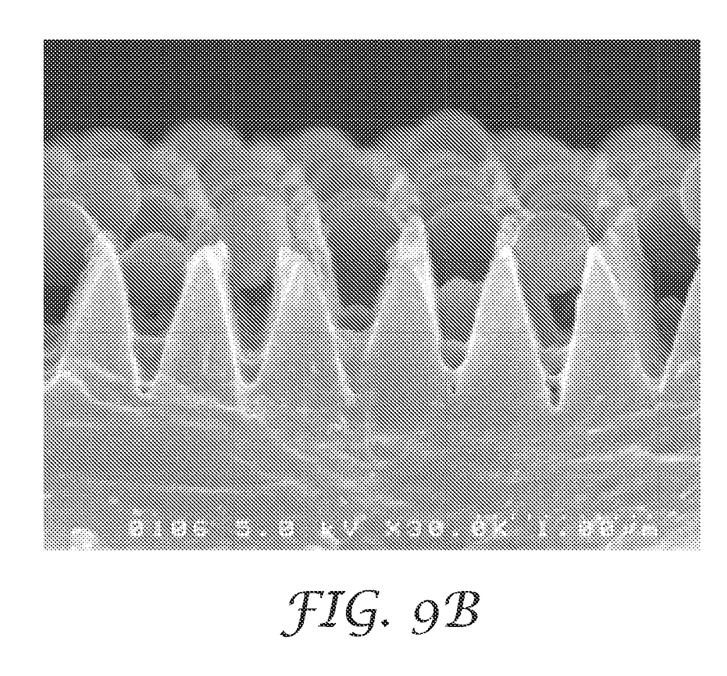
FIG. 9B is an image of a cross-sectional view of nanoparticles on 1D structured film.
Figure 10:
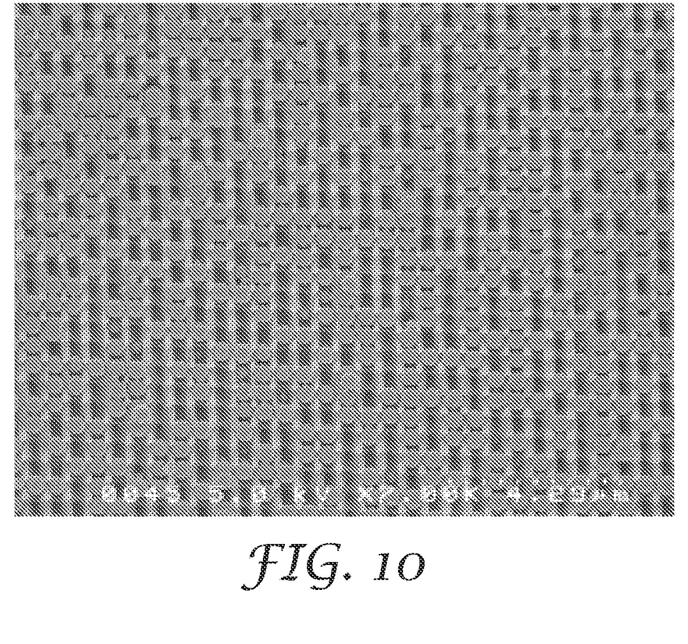
FIG. 10 is an image of nanoparticles on 2D structured film.

Solution B (440 nm $SiO_2$ nanoparticles) was coated onto film having 600 nm 1D structures (Example 2A) and onto film having 500 nm 2D structures (Example 2B) using #5 wire-wound rods (obtained from RD Specialties, Webster, N.Y.). The resulting films were dried in air for 10 min and then UV cured as described in Example 1A. HI-BF solution was coated on the nanoparticle coated 1D and 2D structured films using a #10 wire-wound rod (obtained from RD Specialties, Webster, N.Y.). The resulting films were dried in air for 10 min and then UV cured as described in Example 1A. For comparison, coating Solution B was similarly coated onto unstructured PET film. FIGS. 9A and 9B show a top-view and a cross-sectional view of 440 nm $SiO_2$ nanoparticles on 1D structured film. FIG. 10 shows 440 nm $SiO_2$ nanoparticles on 2D structured film. These figures show that the nanoparticles are partially ordered in these examples. In contrast, the distribution of nanoparticles is typically random when nanoparticles are coated onto a flat surface.

100 nm silicon nitride, 100 nm ITO, and OLED layers were deposited onto 1D structured film (comparative), onto 2D structured film (comparative), onto a glass substrate (comparative), onto 440 nm nanoparticles on 1D structured film (Example 2A), and onto 440 nm nanoparticles on 2D structured film (Example 2B) as described in Example 1A.

Conoscope measurements were made for the OLED device with nanoparticles on 1D structured film as well as the comparative samples. The glass control sample showed a relatively uniform but relatively low intensity distribution. The 1D structured film sample produced small regions with relatively high intensity and somewhat larger regions with lower intensity surrounded by regions of relatively low intensity. Samples made from 440 nm nanoparticles on 1D structured film showed a uniform and high intensity distribution. Samples made from 440 nm nanoparticles on unstructured film gave a relatively low intensity region near the center of the conoscope plot surrounded by relatively high intensity regions. The conoscope results showed that the self-assembled 440 nm nanoparticles on 1D structured film significantly improved angular uniformity of the OLED device compared to either 1D structured film with no nanoparticles or compared to 440 nm nanoparticles coated onto unstructured film. The integrated gain was found to be significantly higher for Example 2A than for the comparative samples.

Figure 11A:
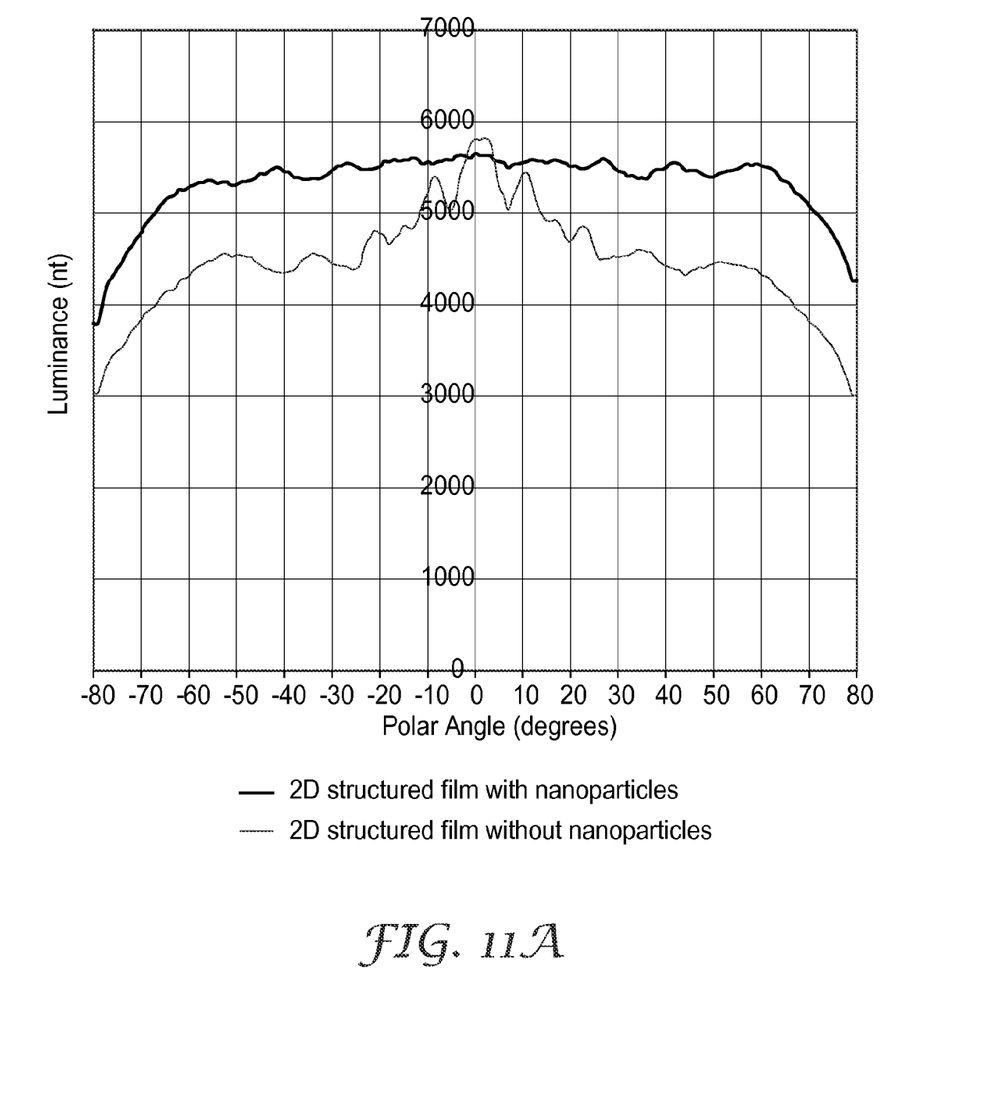
FIG. 11A shows the luminance as a function of polar angle for samples with 2D structured film with and without nanoparticles.
Figure 11B:
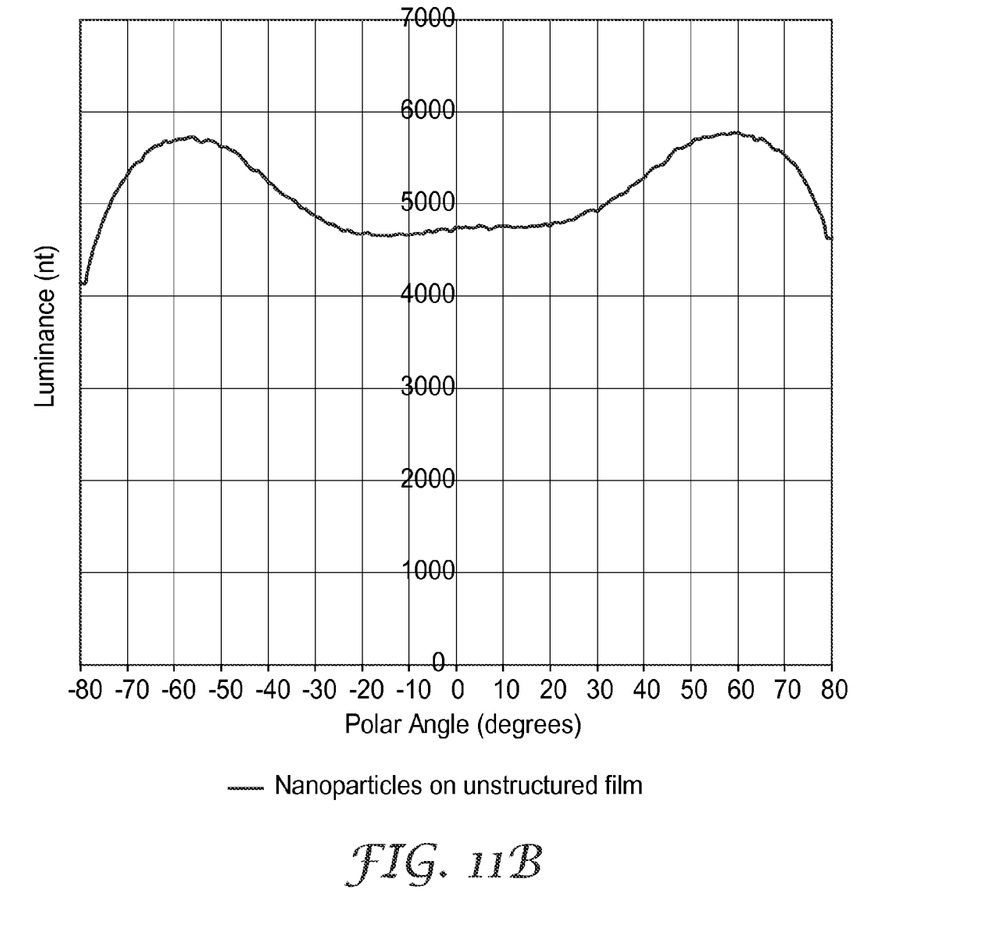
FIG. 11B shows the luminance as a function of polar angle for samples made using nanoparticles on a flat film.

Similarly, conoscope data was obtained for the OLED devices built onto the 440 nm nanoparticle coated 2D structured film (Example 2B) and for comparison for the OLED devices built onto 2D structured film without nanoparticles. The conoscope data for samples made using the 2D structured film without nanoparticles showed a band of relatively high intensity surrounded by lower intensity regions. For the samples with 2D structured film with 440 nm nanoparticles, the intensity was much more uniform, but the relatively high intensity region of the 2D pattern was not completely eliminated. The integrated gain was found to be significantly higher for Example 2B than for the comparative samples. The luminance determined from the conoscope data are shown in FIGS. 11A and 11B. FIG. 11A shows the luminance as a function of polar angle along a zero degree azimuth relative to axes of the 2D structures for samples with 2D structured film with and without nanoparticles, and FIG. 11B shows the luminance as a function of polar angle for samples made using nanoparticles on a flat film.

Example 3

440 nm $SiO_2$ Nanoparticles Mixed with Back Fill on 1D Structure

Solution C (440 nm $SiO_2$ nanoparticles) was coated onto 600 nm 1D structured film using #5 and #10 wire-wound rods (obtained from RD Specialties, Webster, N.Y.). The resulting films were then dried in air for 10 min and then UV cured as described in Example 1A. The refractive index of the layer of 440 nm nanoparticles mixed with backfill was measured using a Metricon Model 2010 Prism Coupler, and was found to be 1.83.

Figure 12:
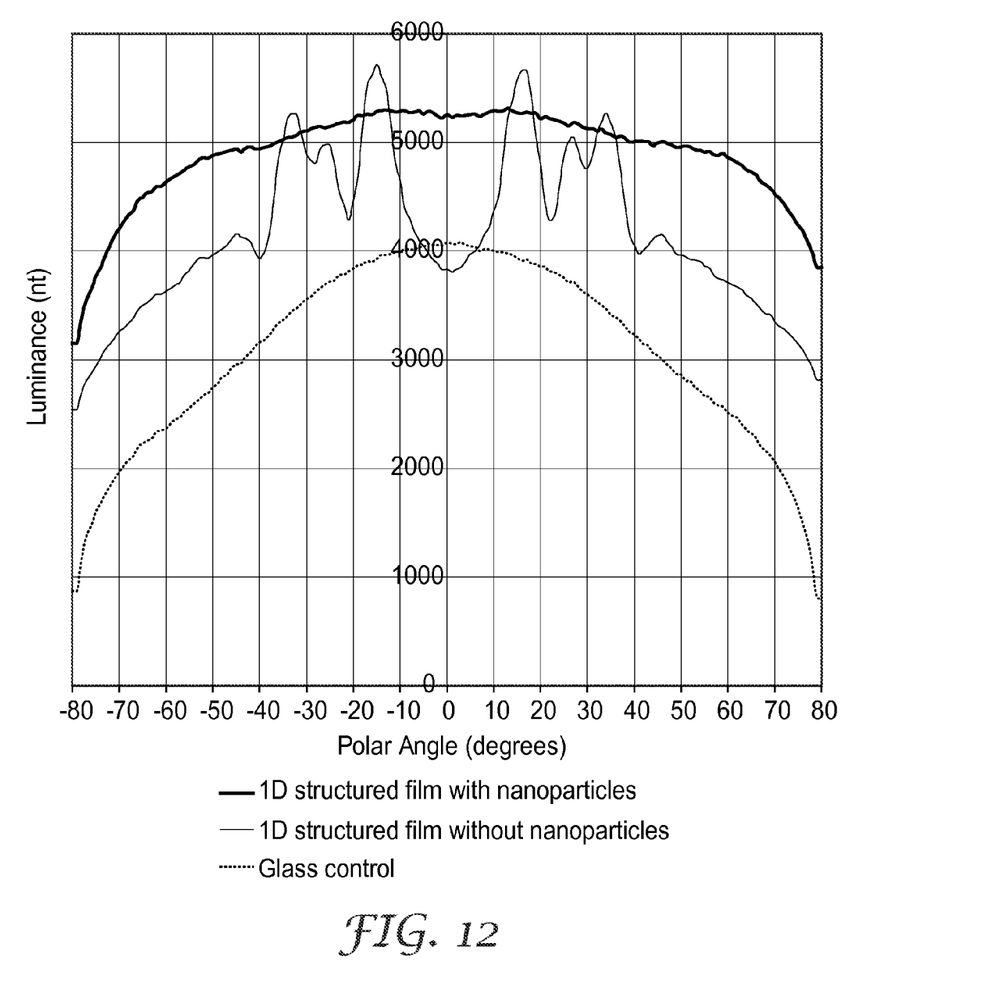
FIG. 12 shows the luminance as a function of polar angle for samples with 1D structured film with and without nanoparticles and for a sample made using a glass substrate without nanoparticles or nanostructures.

100 nm silicon nitride and OLED layers were deposited onto a glass control (comparative), onto a 1D structured film without nanoparticles (comparative), and onto the 1D structured film with 440 nm nanoparticles in backfill (Example 3) as in Example 1A. Conoscope data was obtained for OLED device of Example 3 as well as the comparative samples. The 440 nm nanoparticles in backfill on 1D structured film significantly improved both angular uniformity of the OLED device and integrated gain. FIG. 12 shows the luminance as a function of polar angle along a zero degree azimuth relative to direction of the 1D structures for samples with 1D structured film with and without nanoparticles and for the sample made using the glass substrate without nanoparticles or nanostructures.

Examples 4 and 5

Roll to Roll Process for Hybrid Light Extraction Film

Two Step Process (Example 4)

Figure 13:
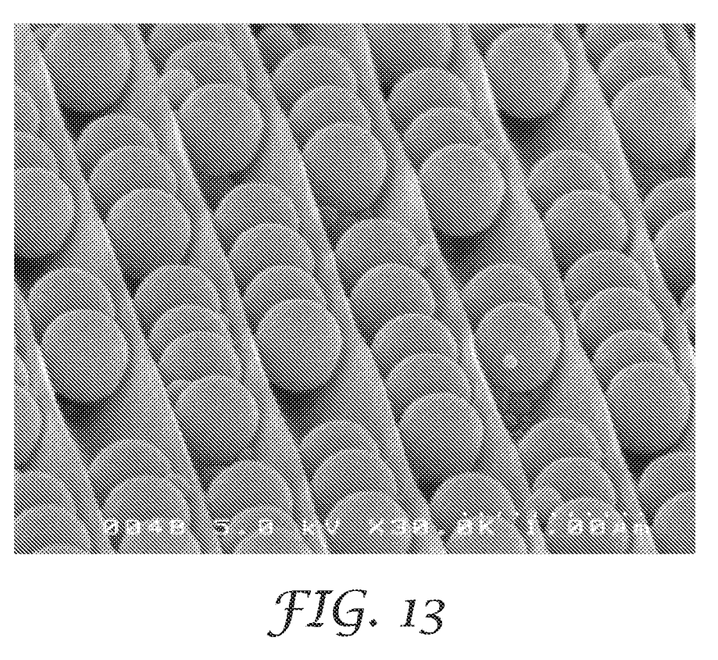
FIG. 13 is an image of nanoparticles being partially ordered by a 1D structure.

Solution B (440 nm $SiO_2$ nanoparticles) was coated onto film having 600 nm 1D structures using a roll to roll coating process with a web speed of 3.0 m/min (10 ft/min) and a dispersion delivery rate of 4.7 cc/min. The coating was dried in air at room temperature, then subsequently further dried at 82° C. (180° F.) and then cured using a Fusion UV-Systems Inc. Light-Hammer 6 UV (Gaithersburg, Md.) processor equipped with an H-bulb, operating under nitrogen atmosphere at 75% lamp power at a line speed of 3.0 m/min (10 ft/min). An SEM photo of the resulting nanoparticle coating is shown in FIG. 13 where it can be seen that the 440 nm $SiO_2$ nanoparticles were partially ordered by the 600 nm 1D structures.

HI-BF solution was coated onto the nanoparticle coated 1D structured film using a roll to roll coating process with a web speed of 3.0 m/min (10 ft/min) and a dispersion delivery rate of 2.28 cc/min. The coating was dried in air at room temperature, then subsequently further dried at 82° C. (180° F.) and then cured using a Fusion UV-Systems Inc. Light-Hammer 6 UV (Gaithersburg, Md.) processor equipped with an H-bulb, operating under nitrogen atmosphere at 75% lamp power at a line speed of 3.0 m/min (10 ft/min).

One Step Process (Example 5)

Solution C (440 nm $SiO_2$ nanoparticles) was coated onto film having 600 nm 1D structures using a roll to roll coating process with a web speed of 4.6 m/min (15 ft/min) and a dispersion delivery rate of 7.29 cc/min. The coating was dried in air at room temperature, then subsequently further dried at 82° C. (180° F.) and then cured using a Fusion UV-Systems Inc. Light-Hammer 6 UV (Gaithersburg, Md.) processor equipped with an H-bulb, operating under nitrogen atmosphere at 75% lamp power at a line speed of 4.6 m/min (15 ft/min). An SEM image of the resulting 440 nm NP mixed in backfill on 600 nm 1D structured film showed that backfill effectively planarized the 1D structure. For comparison, coating Solution C was similarly coated onto unstructured PET film.

OLED Devices and Conoscope Results 100 nm silicon nitride, 100 nm ITO, and OLED layers were deposited onto 440 nm nanoparticles on 1D structured film (Example 4), onto 440 nm nanoparticles in backfill on 1D structured film (Example 5), onto 440 nm nanoparticles in backfill on unstructured PET film (comparative) and onto a glass substrate (comparative). Green emitting OLEDs were made as described in Example 1A. Red OLEDs were constructed similarly but with the following OLED layers: HIL (300 nm)/HTL (40 nm)/Red EML (30 nm)/ETL (20 nm)/LiF (1 nm)/Al (200 nm).

Conoscope measurements were made for multiple samples. The conoscope results showed that the self-assembled 440 nm nanoparticles on 1D structured film (Example 4) significantly improved angular uniformity of the OLED device compared to either 1D structured film with no nanoparticles or to 440 nm nanoparticles coated onto unstructured film. Table 2 shows a summary of on-axis gain and total (integrated) gain for green and red OLEDs for Examples 4 and 5 and for OLEDs made using nanoparticles on unstructured film (comparative). The gains reported in Table 2 are normalized so that the samples made using a glass substrate with no extraction features had an integrated gain of unity.

TABLE 2

|  | Nanoparticles on unstructured film (comparative) | Example 4 | Example 5 |
| --- | --- | --- | --- |
| On-axis Gain (Green LED) | 1.35 | 1.5-1.6 | 1.7-1.8 |
| Total Gain (Green LED) | Up to 1.8 | Up to 2.1 | Up to 2.2 |

TABLE 2-continued

| | Nanoparticles on unstructured film (comparative) | Example 4 | Example 5 |
|---|---|---|---|
| On-axis Gain (Red LED) | 1.3 | 1.5-1.7 | 1.5-1.7 |
| Total Gain (Red LED) | 1.4-1.5 | 1.65 | 1.75 |

The invention claimed is:

1. A light extraction film having nanoparticles and periodic structures, comprising:
 a substantially transparent substrate;
 one-dimensional periodic structures on the substantially transparent substrate, wherein a width and a pitch of the periodic structures are each less than or equal to 600 nm;
 light scattering nanoparticles applied in a surface layer manner over the periodic structures in a monolayer of the nanoparticles, wherein the nanoparticles are substantially aligned within the periodic structures; and
 a planarizing backfill layer applied over the periodic structures and the nanoparticles, forming a substantially planar surface of the backfill layer,
 wherein an index of refraction of the backfill layer is higher than an index of refraction of the periodic structures.

2. The light extraction film of claim 1, wherein the periodic structures comprise linear prisms.

3. The light extraction film of claim 1, wherein the periodic structures are formed integrally with the substrate.

4. The light extraction film of claim 1, further comprising an adhesive optical coupling layer applied to the substantially planar surface of the backfill layer.

5. The light extraction film of claim 1, where the planarizing backfill layer comprises an adhesive for bonding the light extraction film to a light output surface of an OLED device.

6. The light extraction film of claim 1, wherein the nanoparticles have diameters substantially equal to or less than a pitch of the periodic structures.

7. The light extraction film of claim 6, wherein the diameters of the nanoparticles are substantially equal to one-fourth to one times the pitch of the periodic structures.

8. A method for providing a light extraction film on an organic light emitting diode (OLED) device having a surface that outputs light, comprising:
 providing a light extraction film, comprising:
  a substantially transparent substrate;
  one-dimensional periodic structures on the substantially transparent substrate,
 wherein a width and a pitch of the periodic structures are each less than or equal to 600 nm;
  light scattering nanoparticles applied in a surface layer manner over the periodic structures in a monolayer of the nanoparticles, wherein the nanoparticles are substantially aligned within the periodic structures; and
  a planarizing backfill layer applied over the periodic structures and the nanoparticles, forming a substantially planar surface of the backfill layer,
  wherein an index of refraction of the backfill layer is higher than an index of refraction of the periodic structures;
 applying an adhesive to the substantially planar surface of the backfill layer; and
 laminating the light extraction film to the OLED device such that the substantially planar surface of the backfill layer is located against the light output surface of the OLED device,
 wherein the adhesive provides for optical coupling between the light output surface of the OLED device and the backfill layer.

9. A method for providing a light extraction film on an organic light emitting diode (OLED) device having a surface that outputs light, comprising:
 providing a light extraction film, comprising:
  a substantially transparent substrate;
  one-dimensional periodic structures on the substantially transparent substrate,
 wherein a width and a pitch of the periodic structures are each less than or equal to 600 nm;
  light scattering nanoparticles applied in a surface layer manner over the periodic structures in a monolayer of the nanoparticles, wherein the nanoparticles are substantially aligned within the periodic structures; and
  a planarizing backfill layer applied over the periodic structures and the nanoparticles, forming a substantially planar surface of the backfill layer,
  wherein an index of refraction of the backfill layer is higher than an index of refraction of the periodic structures;
 applying an adhesive to the light output surface of the OLED device; and
 laminating the light extraction film to the OLED device such that the substantially planar surface of the backfill layer is located against the light output surface of the OLED device,
 wherein the adhesive provides for optical coupling between the light output surface of the OLED device and the backfill layer.

* * * * *